United States Patent [19]
Schueler

[11] Patent Number: 5,637,879
[45] Date of Patent: Jun. 10, 1997

[54] FOCUSED ION BEAM COLUMN WITH ELECTRICALLY VARIABLE BLANKING APERTURE

[76] Inventor: Bruno W. Schueler, 2208 Glenkirk Dr., San Jose, Calif. 95124

[21] Appl. No.: 618,599

[22] Filed: Mar. 20, 1996

[51] Int. Cl.⁶ .................................................. H01J 37/317
[52] U.S. Cl. .................. 250/492.21; 250/309; 250/396 R
[58] Field of Search ........................ 250/492.21, 492.23, 250/492.2, 398, 396 R, 309

[56] References Cited

U.S. PATENT DOCUMENTS

| | | | |
|---|---|---|---|
| 4,755,685 | 7/1988 | Kawanami et al. | 250/492.21 |
| 5,194,739 | 3/1993 | Sato et al. | 250/423 |
| 5,289,010 | 2/1994 | Shohet | 250/492 |
| 5,294,794 | 3/1994 | Davies | 250/287 |
| 5,369,279 | 11/1994 | Martin | 250/396 R |
| 5,422,490 | 6/1995 | Nakamura et al. | 250/492.21 |

*Primary Examiner*—Jack I. Berman
*Assistant Examiner*—Kiet T. Nguyen
*Attorney, Agent, or Firm*—Robert Samuel Smith

[57] ABSTRACT

A focused ion beam column featuring a combination of blanker electrodes and a chicane system of electrodes which permit selection of a target spot size by selection of appropriate voltages applied to the chicane electrodes. The chicane potentials deflect the beam such as to select the closest distance between the center of the beam and the edge of a blocker plate thus reducing beam blurring when the beam is quickly turned off and on.

4 Claims, 5 Drawing Sheets

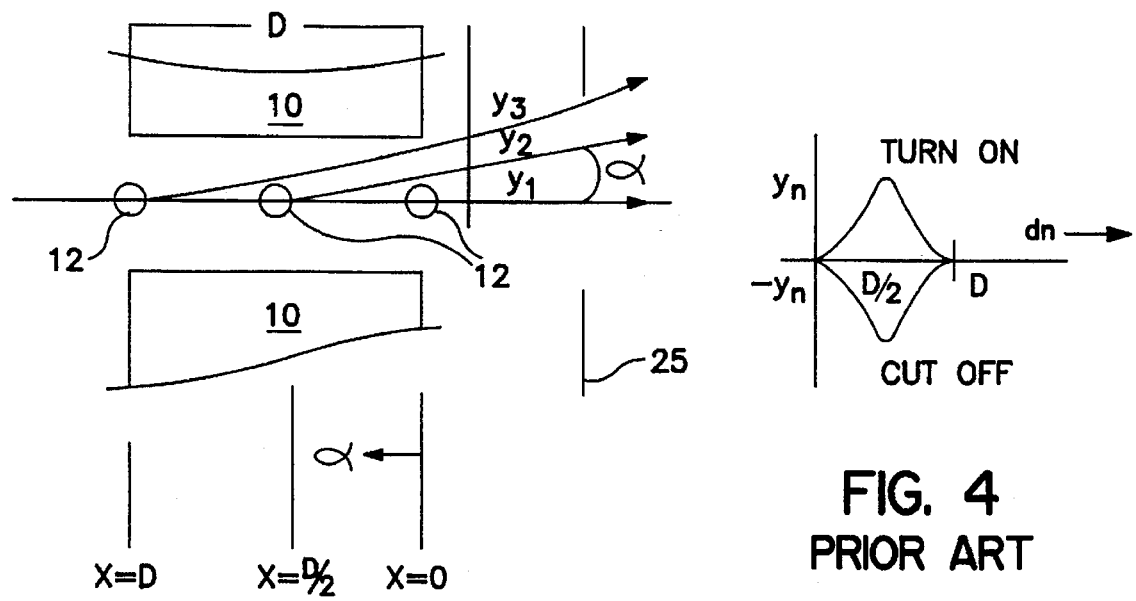
FIG. 3
PRIOR ART
FIG. 4
PRIOR ART
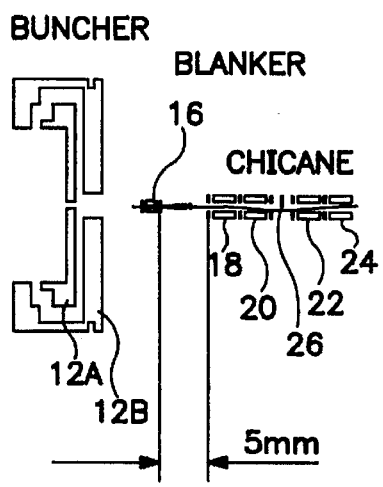
FIG. 5A
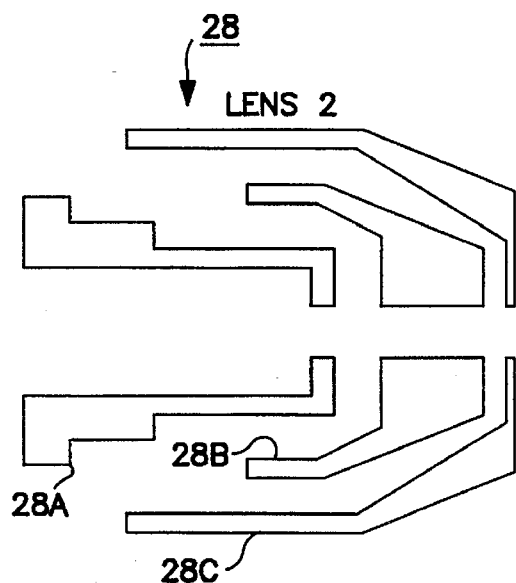
FIG. 5B

FOCUSED ION BEAM COLUMN WITH ELECTRICALLY VARIABLE BLANKING APERTURE

FIELD OF THE INVENTION

This invention relates to focused ion beam (FIB) columns and particularly to a column having blanker electrodes and focusing lenses in combination with a chicane arrangement configured for removing neutrals and to control the effective exit aperture size of the ion beam by controlling the potential applied to the chicane arrangement.

BACKGROUND AND PRIOR ART

The advancement of pulsed ion beam technology has been motivated by the potential to use such beams in applications requiring the bombardment by or deposition of a precisely controlled quantity of charged particles onto very small well defined target areas. Such applications include implantation of ions on semiconductor surfaces to produce components of an integrated circuit, sputtering from localized areas of a target to analyze the chemical nature of the surface using MS (mass spectroscopy), producing chemical changes in small localized areas such as are required in developing photo resist, and chemical milling to produce tiny well defined features on the target surface.

The ideal pulsed beam for these applications has a small cross section, is pure in terms of the absence of neutral particles and spread in the range of particle weight (elimination of isotopes and/or ion species having identical charge but different weight) and minimal range of energy (velocity) of the ions.

FIG. 1 shows a "column" 11 for generating a pulsed ion beam 13 according to the present state of the art. The beam 13 originates in source 15 and is formed by "beam forming" lens 17. Beam 13 then passes through "beam defining" aperture 19 which limits the outer envelop (divergence) of the beam 13. Beam 13 then passes through a crossover point 21 which is midway between two blanker electrodes 10 and through a "blanking" aperture 25. Objective lens 27 focuses beam 13 onto the target surface 29. A pulsed field applied between blanker plates 23 periodically deflects the beam 13 so that the beam is cutoff periodically by blanking aperture 25 thereby generating the pulsed beam.

The cross sectional area of the beam 13 (divergence of the beam 13 from the cross over location 21) is determined by the size of the "beam defining" aperture 19 and illustrated by the comparison of FIG. 1 showing a large beam defining aperture 19A to FIG. 2 showing a small beam defining aperture 19B. In columns of the present art, the user can select the size of the aperture (19A or 19B) corresponding to whether he requires a large spot size with a large current or a small spot size with a small current. According to the present art, the size of the blanking aperture 25 is fixed by the largest size of beam cross section that the user requires. However the use of a large blanking aperture places a limit on the minimum spot size that can be achieved by reducing the size of the beam defining aperture for reasons which are discussed in connection with FIGS. 3 and 4.

Although I do not wish to be bound by any theories that are presented in this specification, it is believed that the following discussion illustrates the mechanics of the motion of the beam during cutoff which results in an effective blurring of the beam spot at the target.

Motion of the beam during cutoff is illustrated in FIG. 3 and 4. (prior art).

As illustrated in FIG. 3, the deflection of the particle (defined as the deflection angle $\alpha$) experienced by a particle depends upon the position of the particle between the electrodes in the direction of travel at the instant when the deflecting field is applied. Therefore, the beam does not experience a sharp cutoff when the blanking field is applied but rather a graded reduction of intensity and a divergence of the beam which is manifested as motion of beam due to cutoff.

FIG. 3 shows opposed blanking plates 10 and the position of a beam of particles 12 (three are shown) at the instant (t=0) that a voltage, V, is applied between the plates to deflect the beam so as to turn the beam off as the particles of the beam travel from left to right. The blanking plates have a thickness, D. Each particle is at distance "d" from the exit edge 14 of the blanker plates at the instant the blanking voltage is applied. Blanking aperture 25 that limits the greatest deflection angle of any particle of the beam. Then it can be understood by one having skill in the art that any particle (labelled as the $n^{th}$ particle) which is located a distance, $d_n$, from the exit edge of the blanking plates at the instant the blanking voltage is applied will be diverted so that as it emerges from between the plates, will travel along a straight path given by $$y_n = (Fd_nx)/V^2 + (Fd_n^2)/2V^2$$

where:

x and y are coordinate axes, y being the "vertical" distance from the undetected beam and x is the "horizontal" distance from the edge of blanking plates, F is the force on the particle between the blanking plates equal to the deflection voltage, V, multiplied by the charge on the particle and divided by the separation of the plates;

$d_n$ is the distance along the x axis of the "$n^{th}$" particle from the exit edge of the deflector plates at the instant when the deflection voltage is turned on;

D is the width of the deflection plates measured in the direction of the ubdeflected beam.

The effect of each particle following its unique path is that, after the cutoff voltage is applied, the "$n^{th}$" particle will appear to pass through a location having coordinates, $x_n = D/2$ (the center location between the edges of the plates) and $y_n$ (at a distance $y_n$ from the undetected beam) given where $$y_n = (Fd_nD - Fd_n^2)/2V^2$$

$y_n$ is a quadratic function of $d_n$ having a maximum at the center of the blanking plates, i.e., $d_n = D/2$.

When the beam is turned back on, the paths of the particles again diverge from one another producing a motion of the beam which is in a direction opposite the direction occurring with cut off. FIG. 4 is a plot of $y_n$ vs. $d_n$ for both the turn off and turn on situations.

The effect of the divergence of the beam paths is to cause an apparent growth in the cross section of the beam at the midpoint of the blanker plates by an amount illustrated as $2y_n$ in FIG. 4. thus giving a larger (blurred) spot at the target site. The problem becomes especially severe for pulse lengths of less than about 50 nsec. There are also excessive neutral particles which are undetected by the blanker and therefore contaminate the target surface when they reach the sample.

As discussed above, blurring of spot due to turning the beam off increases as the size of the blanking aperture is increased. However, selecting a size of the blanking aperture to reduce blur when using a small beam defining aperture results in a reduction of the maximum beam current that can be achieved when using a larger beam defining aperture. Although simultaneously selecting a small blanking aperture for use with a small beam defining aperture might be considered, the approach of replacing BOTH apertures is prohibitively inconvenient.

Advancement in the art has included the development of smaller and more efficient ion sources and improvement in the lenses used to form the beam.

The ion source of the present state of the art providing the smallest ion source is the liquid metal ion source in which the ion source is a needle to which an electrical potential is applied to develop a strong field at the tip of the needle. The strong field induces liquid metal wetting the needle to be drawn to the tip where the liquid metal forms an even sharper point. The lower limit of the size of the area emitting ions at the end of the needle is determined by charge interaction between the ions at the point. Areas having a breadth of about 500 Å are achieved by this technique.

Elimination of neutral particles from the beam is achieved by the so-called "chicane" technique in which a beam is deflected by a field so that it passes around a "blocker" (shield). Neutral particles are not deflected by the blocker but separate from the beam and strike the shield, thereby removing them from the beam.

Other disclosures have appeared cataloging the advancements in FIB (focused ion beam) technology.

For example, U.S. Pat. No. 5,369,279 to Martin discloses a chromatically compensated paricle beam column featuring a needle type ion source, one or more round lenses and a plurality of interleaved quadrupole lenses which are intended to reduce chromatic aberration. Chromatic aberration is understood in FIB context as being a spread in the focal length of a lens due to a spread in the energy of the ions.

U.S. Pat. No. 5,194,739 to Sato et al discloses a liquid metal ion source of Ce ions forming a beam focused to a microspot.

U.S. Pat. No. 5,294,794 to Davies discloses a system for compensating for spread in flight time by a circuit that meaures actual flight time of a given mass of ion and then adjusts a drift field to accommodate to deviations of velocity.

U.S. Pat. No. 5,289,010 to Shobet discloses ion implantation having a target with pulses of high voltage applied to the target periodically to implant ions. The plasma is "purified" by passing the plasma through an ion ion plasma resonance system.

A critical review entitled "Focused Ion Beam Technology and Applications" by Meingallis published by the J. Vac. Sci. Technology B 5 (2), Mar/Apr 1987 is incorporated in this specification for further reference in the field.

None of the disclosures of these prior an addresses the problems associated with manual selection of the aperture as discussed above.

SUMMARY

It is an object of this invention to provide a focused ion beam (FIB) column that has means for a user to select a large effective blanking aperture size when using a "large" beam defining aperture size to provide a large beam current with a relatively large target spot size or select a small effective blanking aperture size resulting in small beam current with a small target spot size where the selection is made with greater convenience and precision than could be made such as by mechanically replacing the blanking aperture. It is also an object of this invention to eliminate neutrals that otherwise contaminate the target. The system includes blanking plates which periodically blank the beam thereby generating a pulsed beam, a chicane system of diverting electrodes that divert charged particles, a blocker plate positioned in the chicane arrangement which blocks neutral particles, and means to apply an adjustable voltage to the lens of the chicane arrangement in order adjust the beam of given size (current) as close as possilbe to the blocker plate.

BRIEF DESCRIPTION OF THE DRAWINGS

FIG. 3 illustrates the deflection of a particle between the blanker electrodes.

FIG. 4 is a graph of the virtual particle position between the blanker electrodes.

FIG. 5 shows the construction of the beam column of this invention.

DESCRIPTION OF A BEST MODE

Figure 1:
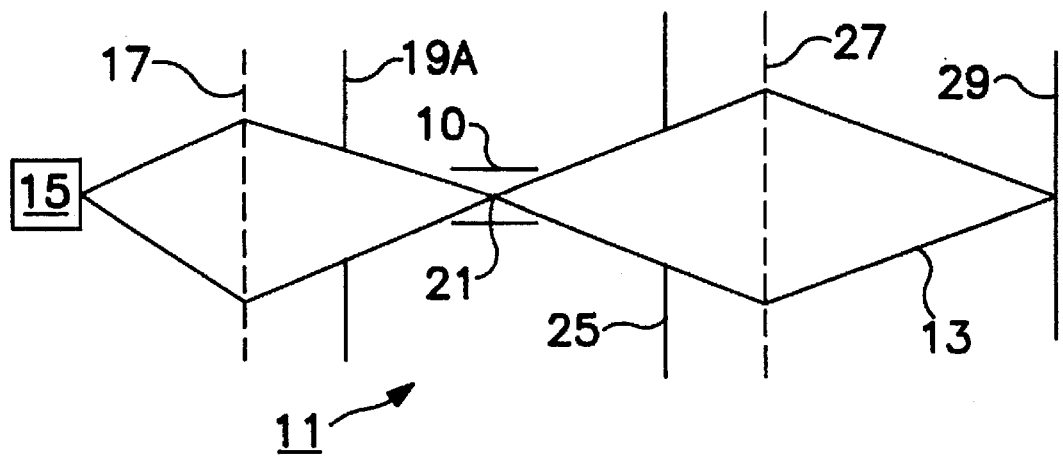
FIG. 1 shows a beam column of the prior art with large beam defining aperture.
Figure 2:
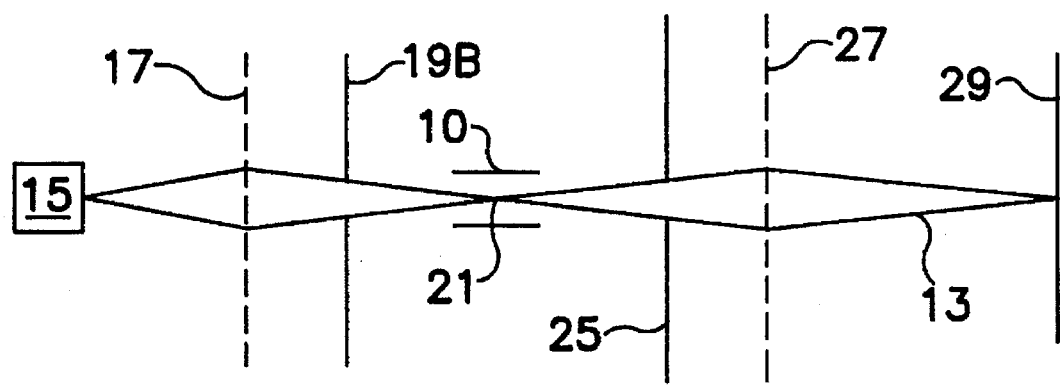
FIG. 2 shows a beam column of the prior art with small beam defining aperture.

Turning now to a discussion of the drawings, FIG. 5 shows an embodiment of the invention having a "buncher" section 12 which consists of electrodes 12A and 12B. Buncher section 12 follows a first lens (not shown in FIG. 5) which is where the beam going from left to right is defined in a well known manner. The beam passes between a pair of opposing blanker plates 16. Application of electrical pulses between the blanker plates causes deflection and cutoff of the beam with each pulse thereby resulting in a pulsed ion beam. The beam then passes through a chicane section which includes four pairs of diverting electrodes 18, 20, 22 and 24. A "blocker electrode 26 is positioned between electrode pair 20 and electrode pair 22. The beam is focused by lens system 28. which has a focal point at the midpoint between blanker plates 16. Lens system 28 is an array of three electrodes, 28A, 28B, 28C constructed and arranged according to well known principles in the art of electron optics.

Figure 6:
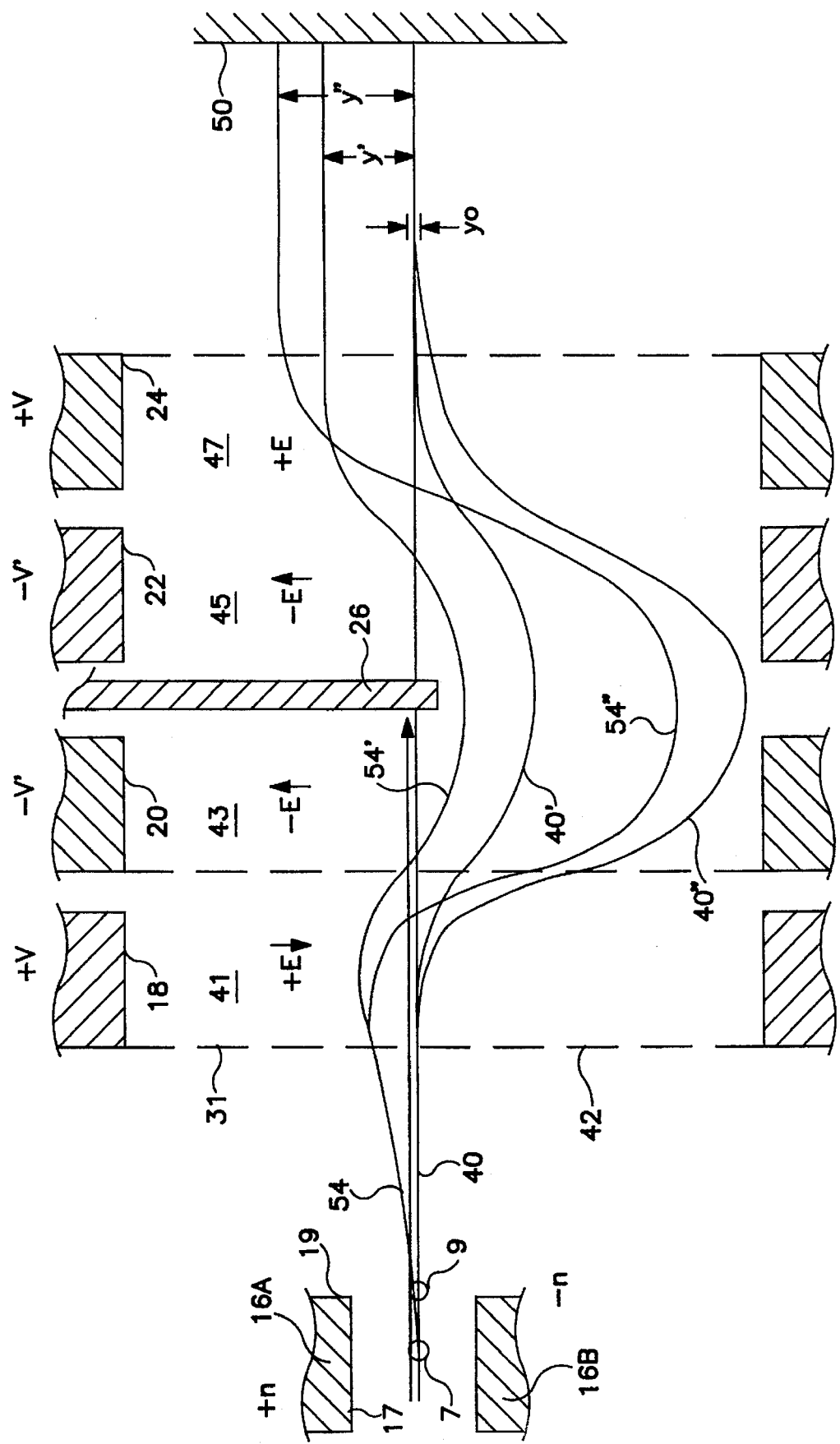
FIG. 6 illustrates the path of a particle as a function of the chicane deflection voltages.

FIGS. 6 shows the combination chicane and blanker system drawn such as to illustrate the to greater advantage than FIG. 5 the motion of particles when the blocker plate does not extend into the path of the particles. Path 54 is the path followed by a particle 7 that is at the leading edge 17 of the blanker 16A at the instant that the blanker voltage, v, is applied between the blanker plates 16A. Path 40 is the path followed by a particle 9 located at the trailing edge 19 at the time the blanking voltage v is applied. Both particles, 7 and 9, proceed along their respective respective paths, 40 and 54, to the leading edge 31 of the chicane. If a low value of voltage ($V=V_{lo}$) and ($V'=V'_{lo}$) is applied between the respective plates, 18–24, then charged particle 9 will follow path 40' being deflected around blocker 26 by fields +E, −E, −E and +E in the regions 41, 43, 45, 47 respectively. After deflection, the particle 9 continues toward the target 50 along a path coincident with the original direction 40.

When larger values of chcane voltage, ($V=V_{hi}$, $V'=V'_{hi}$) are applied to the chicane electrodes 18–24, then particle 9 will follow the path 44" through regions 41, 43, 45, 47.

When large chicane voltages are applied, ($V=V_{hi}$ and $'_{hi}$ applied respectively to electrodes 18A,B, 24 A,B and to electrodes 20 A,B, 22A,B) then the particle 7 suffering the greatest divergence during blanking ($y_3$ in FIG. 1) will follow path 54" and when low chicane voltages are applied ($V=V_{lo}$, $V'=V'_{lo}$) then the particle 7 suffering the greatest divergence will follow path 54'.

Figure 7:
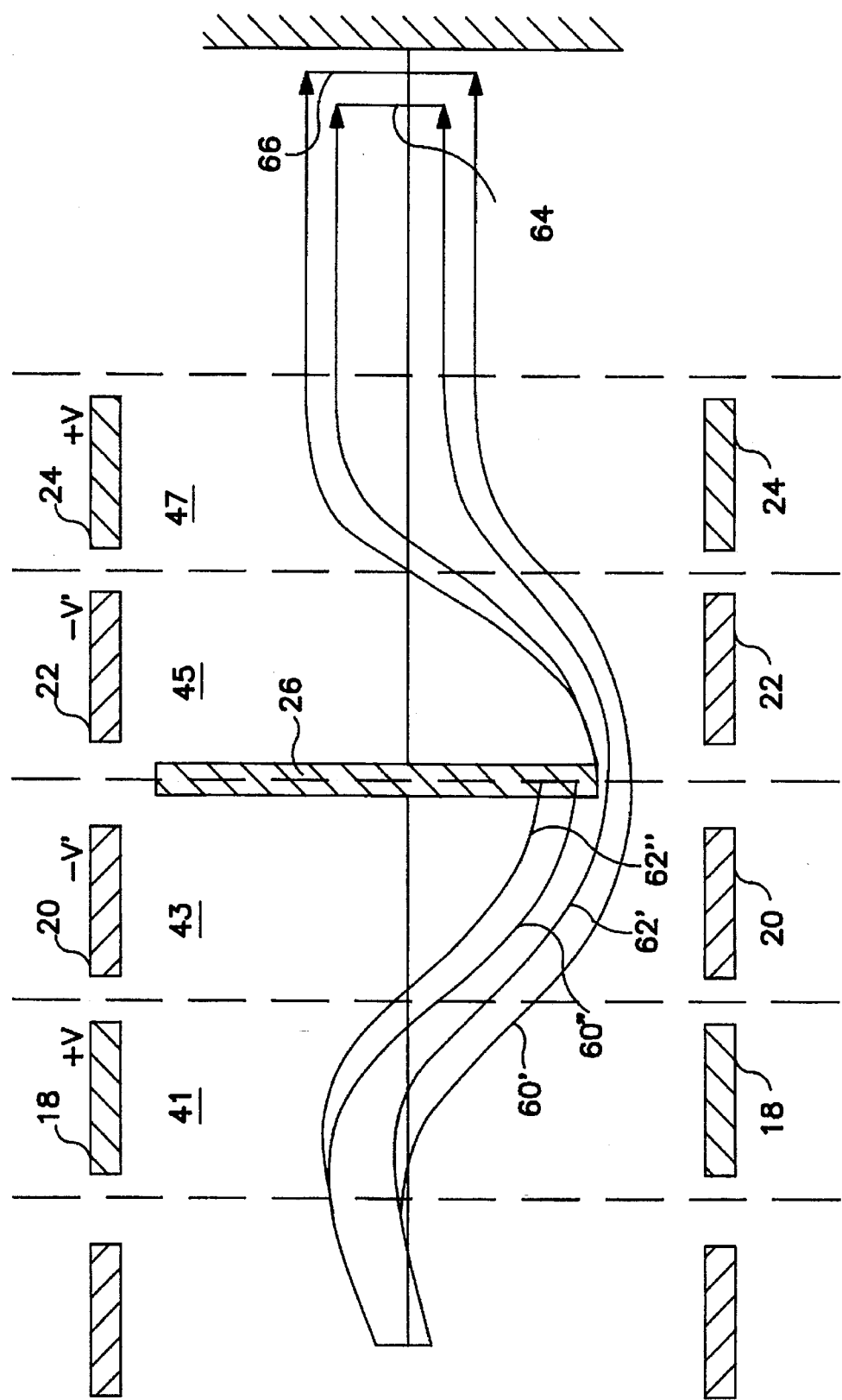
FIG. 7 illustrates the effect of intrusion of the blocker plate into the beam on target spot size.

FIG. 7 illustrates the action of the blocker plate 26 to which the edge of the beam is adjusted as close as possible by an amount determined by the voltages applied to the chicane electrodes thereby controlling the effect of beam blanking on the target spot size. FIG. 7 shows beam 60 having beam boundaries 60' and 60" subject to largest values of voltages V and V' applied to the chicane electrodes and beam 62 having beam boundaries 62' and 62" subject to smallest values of voltages V and V' applied to the chicane electrodes.

Blocker plate 26 extends into the beams 60 and 62 and cuts off edges 60" and 62". However, more of beam 62 is cutoff than of beam 60 resulting in a target spot size 66 for beam 60 that is larger than the target spot size 64 for beam 62.

Neutral particles will be undetected by the chicane arrangement and be blocked by blocker plate 26 from passing through the system.

Figure 8:
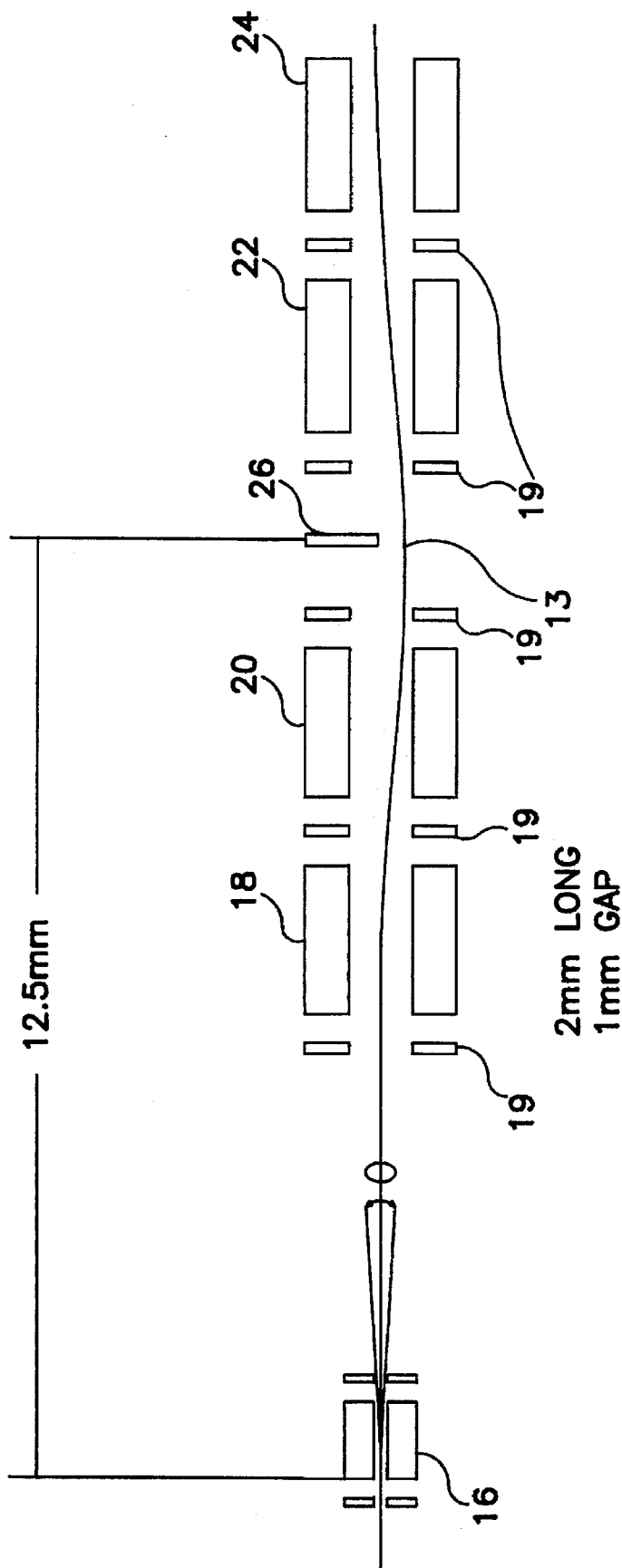
FIG. 8 is a scale drawing of the chicane arrangement with the blanker electrode.

FIG. 8 is a scale drawing of a blanker-chicane arrangement of the invention. Table I gives an example of conditions for obtaining two values of beam diameters, 15 microns and 150 microns for a 25 keV beam. having a current of 200 picoamps and 20 nanoamps repsectively. The figure shows a beam envelope extreme for a 12 mrad beam assuming the beam is offset so that the blocking plate edge protrudes 150 microns below the center axis of the column for rejection of neutral particles. FIG. 8 also shows grounded fringing field electrodes 19 whose use to eliminate field fringing effects of electrodes 18, 20, 22, 24 is well known in the art.

TABLE I

| Beam Diameter | V | V' | effective beam divergence, O |
| --- | --- | --- | --- |
| 150 microns | 360 | 340 | 12 mrad |
| 15 microns | 340 | 321 | 1.2 mrad |

The data of table I exemplifies the effectiveness of the system which is to control effective limiting aperture size (spot size) by controlling the chicane voltage, V. Selection of the chicane voltages selects the closest distance of the edge of the blocker plate to the central axis of the beam and therefore selects the amount that the beam is diminished by partial blocking of the blocking plate.

Neutral particles are also blocked by the blocking plate.

Modifications and variations of the invention may be suggested by reading the specification and studying the drawings which are within the scope of the invention.

For example, other arrangements of chicane electrodes for deflecting the beam may be used such that the direction of the beam is not restored to its original direction.

I therefore wish the scope of my invention to be defined by the scope of the appended claims.

I claim:

1. A focused ion beam column which comprises:
   a source for producing a plurality of ions;
   means for forming a beam of said plurality of ions;
   said beam projected along a beam axis;
   a pair of blanker electrode means for generating a beam of pulses of ions from said beam of said plurality of ions in response to voltage pulses applied to said pair of blanker electrode means;
   a chicane means for deflecting said beam of pulses of ions;
   a blocker means for blocking a part of each pulse of ions;
   means for applying a selected plurality of deflection electrical potentials to said chicane means; and
   a target;
   said source, forming means, blanker electrode means, chicane means, blocker means, target and applying means all arranged in operable combination such that said ions from said source formed into said beam by said beam forming means is directed to pass between said blanket electrodes where said plurality of voltage pulses applied to said blanker plates deflects said beam to form said plurality of pulses of ions, one pulse of ions with each voltage pulse and emerge from between said blanker plates and such that each pulse of ions entering said chicane means is separated into a first part which strikes said blocker means and a second part which is directed around said blocker means and strikes an area of said target, and a size of said area being dependent upon said plurality of deflection potentials.

2. The column of claim 1 wherein said blocker means is located in a position to prevent neutral particles generated by said source of ions from passing through said chicane means to said target.

3. The column of claim 1 wherein said chicane means comprises:
   first, second, third and fourth pair of electrodes, each electrode being a plate having said flat surface parallel to and spaced a common distance from and facing a flat surface of said electrode paired with said each electrode with said first pair of electrodes having an end adjacent an end of said second pair of electrodes, said second pair of electrodes having an opposite end adjacent an end of said third pair of electrodes, said third pair of electrodes having an opposite end adjacent an end of said fourth pair of electrodes, and all said flat surfaces being parallel to one another; and
   said blocker means being a blocker plate perpendicular to each electrode and said beam axis and said blocker plate positioned between said second and third pair of electrodes and extending into said space between said electrode and its pair member such as to intersect said beam axis whereby said beam of pulses of ions is deflected toward a first direction by passing between said first pair of electrodes having a first one of said plurality of electrical potentials applied between said first pair of electrodes and then said beam of pulses of ions is deflected in a direction parallel to said beam axis by passing between said second pair of electrodes with a second one of said electrical potentials applied between said second pair of electrodes and then said beam of pulses of ions is deflected to pass in a second direction by a third electrical potential applied between said third pair of electrodes and then is deflected to pass in a direction toward said target coincident with said beam axis by a fourth one of said plurality of electrical potentials applied between said fourth pair of electrodes as said beam passes between said fourth pair of electrodes whereby a closest distance between a central axis of said beam of pulses of ions and an edge of said blocker plate is selected by selecting said electrical potentials.

4. A method for selecting a target spot size of a beam of pulses of ions which includes the steps:
  (a) providing a focused ion beam column which comprises:
    (i) a source for producing a plurality of ions;
    (ii) means for forming a beam of ions from said plurality of ions;
    (iii) said beam of ions projected along a beam axis;
    (iv) a pair of blanker electrode means for generating a beam of pulses of ions from said beam of ions in response to voltage pulses applied to said pair of blanker electrode means;
    (v) a chicane means for deflecting said beam of pulses of ions;
    (vi) a blocker means for blocking a part of each pulse of ions;
    (viii) means for applying a selected plurality of deflection electrical potentials to said chicane means;
    (ix) a target; and
    (x) said source, beam forming means, blanker electrode means, chicane means, blocker means, target and potential applying means all arranged in operable combination such that said ions from said source formed into said beam of ions by said beam forming means is directed to pass between said blanker electrodes where said plurality of voltage pulses applied to said blanker plates deflects said beam to form said plurality of pulses of ions, one pulse of ions with each voltage pulse and emerge from between said blanker plates and such that each pulse of ions entering said chicane means is separated into a first part which strikes said blocker means and a second part which is directed around said blocker means and strikes an area of said target, a size of said area being dependent upon said plurality of deflection potentials; and
  (b) applying selected potentials of said plurality of deflection electrical potentials to said chicane means to generate a required target spot size when said beam of ions is passed through said focused ion beam column; and
  (c) generating said beam of ions and passing said beam of ions through said focused ion beam column.

* * * * *